(12) United States Patent
Mouli (10) Patent No.: US 7,485,904 B2
(45) Date of Patent: **\*Feb. 3, 2009**

(54) PIXEL WITH STRAINED SILICON LAYER FOR IMPROVING CARRIER MOBILITY AND BLUE RESPONSE IN IMAGERS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 76 days.

This patent is subject to a terminal disclaimer.

(21) Appl. No.: 11/590,761

(22) Filed: Nov. 1, 2006

(65) Prior Publication Data

US 2007/0057298 A1    Mar. 15, 2007

Related U.S. Application Data

(63) Continuation of application No. 10/612,974, filed on Jul. 7, 2003, now Pat. No. 7,164,182.

(51) Int. Cl.
*H01L 31/02* (2006.01)
(52) U.S. Cl. .................. 257/233; 257/239; 257/292; 257/E27.133
(58) Field of Classification Search ............ 257/233, 257/239, 291, 292, E27.132, E27.133
See application file for complete search history.

(56) References Cited

U.S. PATENT DOCUMENTS 6,310,366 B1   10/2001  Rhodes et al.
6,583,015 B2   6/2003   Fitzgerald et al.
6,613,695 B2   9/2003   Pomarede et al.
6,984,591 B1   1/2006   Buchanan et al.
7,164,182 B2 * 1/2007   Mouli .................. 257/436

FOREIGN PATENT DOCUMENTS

EP         0 940 854 A2    9/1999
WO      WO 02/33755 A2    4/2002

OTHER PUBLICATIONS

Intellectual Property Office of Singapore, Invitation to Respond to Written Opinion, issued Feb. 26, 2008.
Austrian Patent Office, Written Opinion issued Jan. 18, 2008.
Communication from European Patent Office and Examination Report issued Aug. 29, 2007.
Freeman, G. Jagannathan, B., Zamdmer, R., Groves, Singh, Y., Tretiakov, Kumar, M., Johnson, J., Plouchart, J., Greenbert, D., Koester, S., Schaub, J. Integrated SiGe and Si Device Capabilities and Trends for Multi-Gigahertz Applications, Internatioal Journal of High Speed Electronics and Systems, vol. 13, No. 1 (2003) pp. 175-219.
Maiti, C., Bera, L. and Chattopadhyay, S. Topical Review Strained-Si Heterostructure Field Effect Transistors, Semiconductor Science Technology 13 (1998) pp. 1225-1246.

* cited by examiner

*Primary Examiner*—Minh-Loan T Tran
(74) *Attorney, Agent, or Firm*—Dickstein Shapiro LLP (57) ABSTRACT

An imager having a pixel cell having an associated strained silicon layer. The strained silicon layer increases charge transfer efficiency, decreases image lag, and improves blue response in imaging devices.

19 Claims, 10 Drawing Sheets

Prior Art

FIG. 10 ns of the United States

PIXEL WITH STRAINED SILICON LAYER FOR IMPROVING CARRIER MOBILITY AND BLUE RESPONSE IN IMAGERS

This application is a continuation application of application Ser. No. 10/612,974, filed Jul. 7, 2003 now U.S. Pat. No. 7,164,182, which is hereby incorporated herein by reference in its entirety.

FIELD OF THE INVENTION

The present invention relates generally to image sensors, and more specifically to a pixel cell having an associated strained silicon layer and method of fabrication thereof.

BACKGROUND OF THE INVENTION

Imaging devices, including charge coupled devices (CCD) and complementary metal oxide semiconductor (CMOS) sensors have commonly been used in photo-imaging applications.

Typically, a digital imager circuit includes a focal plane array of pixel cells, each one of the cells including a photosensor, e.g. a photogate, a photoconductor, or a photodiode. A CMOS imager is one such digital imager circuit and includes a readout circuit connected to each pixel cell in the form of an output transistor. The photosensor converts photons to electrons which are typically transferred to a floating diffusion region, connected to the gate of a source follower output transistor. A charge transfer device can be included as well and may be a transistor for transferring charge from the photosensor to the floating diffusion region. Imager cells also typically have a transistor for resetting the floating diffusion region to a predetermined charge level prior to charge transference. The output of the source follower transistor is gated as an output signal by a row select transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference in their entirety.

Figure 1:
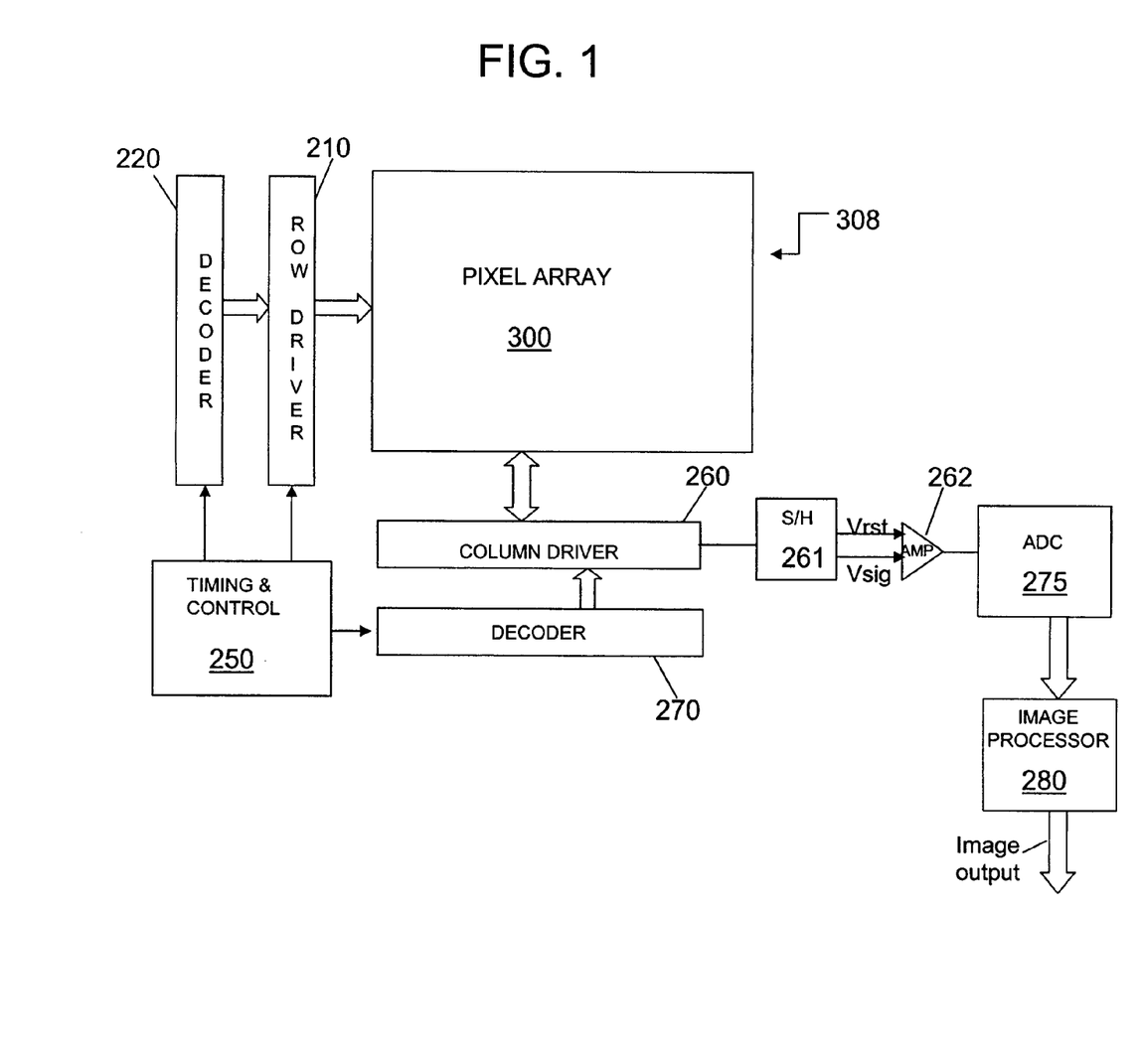
FIG. 1 illustrates a schematic diagram of a CMOS imager chip having a pixel array.

FIG. 1 illustrates a block diagram of a CMOS imager device 308 having a pixel array 300 with each pixel cell being constructed as described above. Pixel array 300 comprises a plurality of pixels arranged in a predetermined number of columns and rows (not shown). The pixels of each row in array 300 are all turned on at the same time by a row select line, and the pixels of each column are selectively output by respective column select lines. A plurality of row and column lines is provided for the entire array 300. The row lines are selectively activated by a row driver 210 in response to a row address decoder 220. The column select lines are selectively activated by a column driver 260 in response to a column address decoder 270. Thus, a row and column address is provided for each pixel. The CMOS imager device 308 is operated by a timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$) and a pixel image signal ($V_{sig}$), are read by a sample and hold circuit 261 associated with the column device 260. A differential signal ($V_{rst}-V_{sig}$) is produced by differential amplifier 262 for each pixel that is amplified and digitized by analog to digital converter 275 (ADC). The analog-to-digital converter 275 supplies the digitized pixel signals to an image processor 280, which forms and outputs a digital image.

P-n-p photodiodes are a type of photosensor sometimes used in CMOS pixel cells. In a CMOS imager, when incident light strikes the surface of a photodiode, electron/hole pairs are generated in the p-n junction of the photodiode. The generated electrons are collected in the n-type region of the photodiode. Photo charge may be amplified when it moves from the initial charge accumulation region to the floating diffusion region or it may be transferred to the floating diffusion region via a transfer transistor. The charge at the floating diffusion region is typically converted to a pixel output voltage by the source follower transistor described above.

Figure 2:
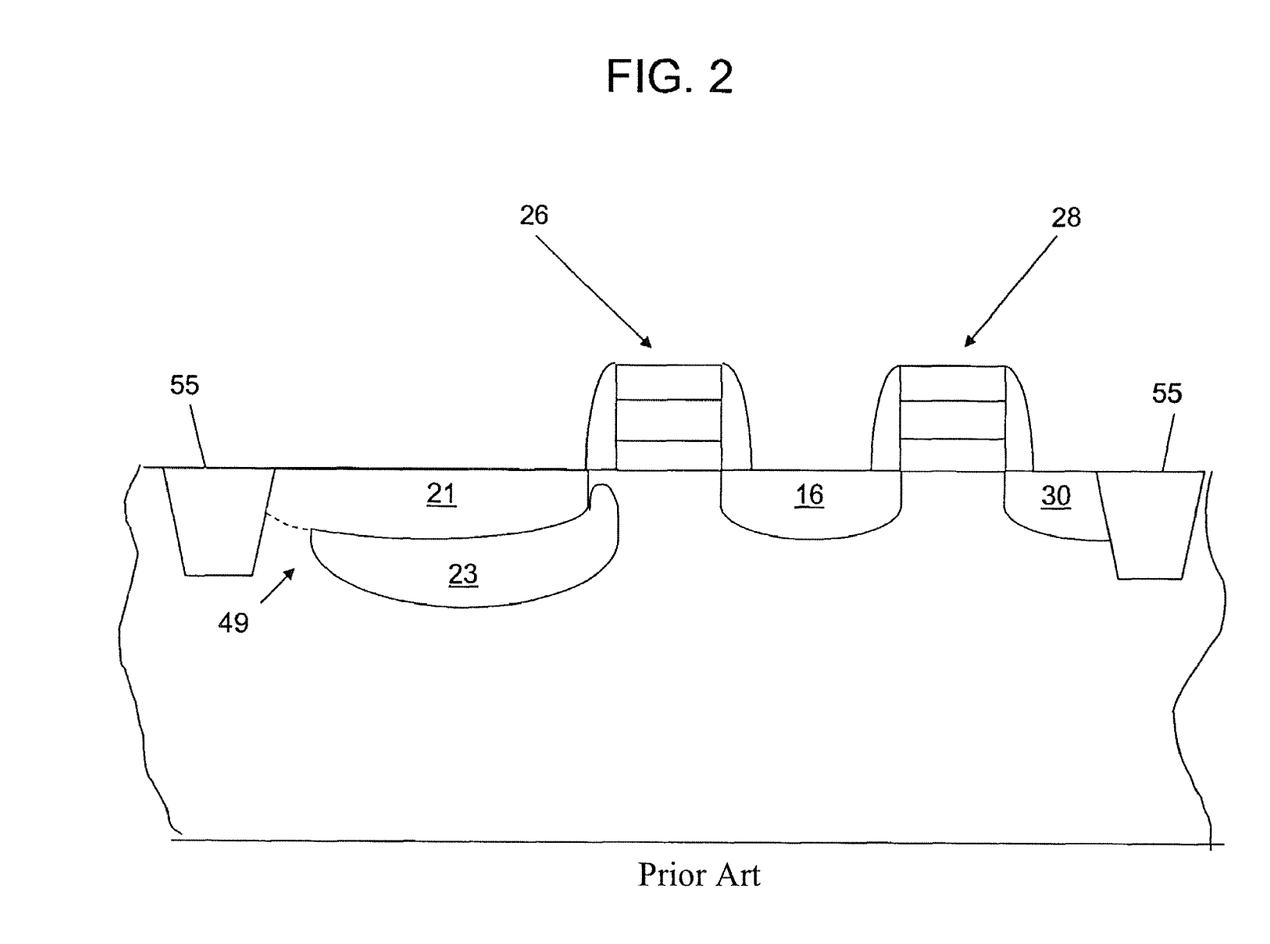
FIG. 2 illustrates a cross-sectional view of a conventional pixel cell.

A portion of a CMOS pixel cell having a p-n-p photodiode 49 is illustrated in FIG. 2. A source follower transistor and row select transistor would be included in the 4-transistor (4-T) cell of FIG. 2, but are not shown in the depicted cross-section. A p+ region 21 is shown above an n-type region 23 to form the photodiode 49. Typically, the p+ region 21 is implanted to create a p-n junction. The illustrated pixel includes a transfer transistor with associated gate 26 and a reset transistor with associated gate 28, along with a floating diffusion region 16 and source/drain region 30. The illustrated pixel also includes shallow trench isolation (STI) regions 55.

Imagers having conventional pixel cells using p-n-p photodiodes often suffer from problems such as inefficient charge transfer and image lag due to potential barriers between the photodiode 49 and transfer gate 26 region. Fill factor loss is also a problem associated with conventional CMOS image sensors. Fill factor is a measure of the ratio of electrons produced per given light intensity. Fill factor loss may occur when higher concentrations of p-type dopants are used in the surface of a p-n-p photodiode and diffuse into n-type dopants, thereby compensating them and causing a reduction in fill factor.

Conventional pixel cells may also suffer from poor color fidelity, signal-to-noise ratios, and may not be able to operate over a wide range of lighting conditions. This is especially true with regards to blue response, i.e. The conversion of photons from blue wavelengths to an electrical charge. Because blue photons are absorbed closer to the surface and are, therefore, subject to surface defects and leakage, optimal color fidelity suffers as a result.

BRIEF SUMMARY OF THE INVENTION

Embodiments of the invention provide an imager utilizing a pixel cell having an associated strained silicon layer. The strained silicon layer of the pixel cell increases charge transfer efficiency, decreases image lag, and improves blue response in the imaging device.

BRIEF DESCRIPTION OF THE DRAWINGS

The above-described features and advantages of the invention will be more clearly understood from the following detailed description, which is provided with reference to the accompanying drawings in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "semiconductor substrate" and "substrate" are to be understood to include any semiconductor-based structure. The semiconductor structure should be understood to include silicon, silicon-on-insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "pixel," as used herein, refers to a photo-element unit cell containing a photosensor for converting photons to an electrical signal. For purposes of illustration, a single representative pixel and its manner of formation are illustrated in the figures and description herein; however, typically fabrication of a plurality of like pixels proceeds simultaneously. Accordingly, the following detailed description is not to be taken in a limiting sense, and the scope of the present invention is defined only by the appended claims.

Figure 3:
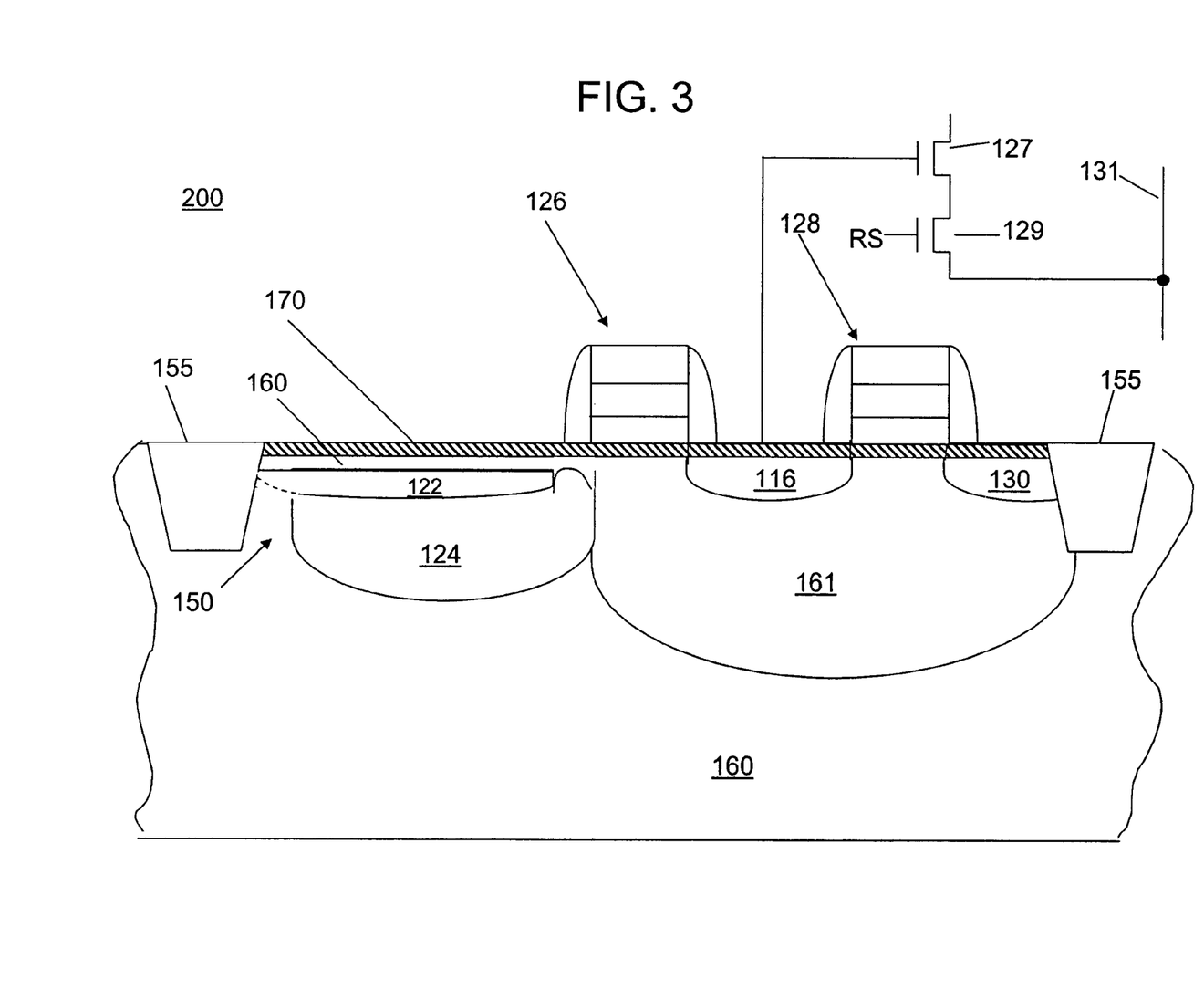
FIG. 3 illustrates a cross-sectional view of a pixel cell incorporating a strained silicon layer constructed in accordance with an exemplary embodiment of the invention.

In the following description, the invention is described in relation to a CMOS imager for convenience; however, the invention has wider applicability to any photosensor of any imager cell. Now referring to the figures, where like reference numbers designate like elements, FIG. 3 illustrates an exemplary pixel cell 200 constructed in accordance with an embodiment of the invention.

The illustrated pixel cell 200 includes a strained silicon layer 170 in association with a substrate 160. Strained silicon layer 170 is not used in conventional CMOS imagers (FIG. 2). The strained silicon layer 170 in the pixel cell 200 shown in FIG. 3 offers advantages over previous imaging technology, including, but not limited to, increased carrier mobility, decreased resistance, and better electron flow. As electron flow increases, performance improves. With the addition of the strained silicon layer 170, charge transfer becomes more efficient, and image lag decreases as potential barriers between a photodiode 150 and a transfer gate region 126 become less of a factor. Also, color fidelity, signal-to-noise ratios, and operation over a wide range of lighting conditions are improved. Additionally, the strained silicon layer 170 improves the blue response in imagers due to its high absorption coefficient.

The illustrated pixel cell 200 includes a substrate 160 having a doped layer or well 161. In addition, and for exemplary purposes only, substrate 160 is a p-type substrate and includes a p-type well 161 more heavily doped than p-type substrate 160. The illustrated pixel cell 200 also includes a photosensor 150. The photosensor 150 has a p+region 122 and an n-type region 124. The photosensor 150 is illustrated as a photodiode, and may be a p-n junction photodiode, a Schottky photodiode, or any other suitable photodiode, but for exemplary purposes is discussed as a p-n-p photodiode. In addition, the photosensor 150 may be a photogate or any other photosensitive region having the ability to convert photons into an electrical charge. The photosensor has a portion that extends into the strained silicon layer 170. This allows for electron exchange between the photosensor 150 and a floating diffusion region 116, discussed further below.

The illustrated pixel cell 200 also includes a transfer transistor with associated gate 126; a reset transistor with associated gate 128; source/drain region 130; and shallow trench isolation (STI) regions 155. A source follower transistor 127 and row select transistor 129 with associated gates are also illustrated in the pixel cell 200, and are shown in electrical schematic form in FIG. 3 because their structure is not important to the invention. The output of the row select transistor 129 is connected with a column line 131. Although shown in FIG. 3 as a 4-transistor (4T) configuration with a transfer transistor, the invention can also be utilized in a 3-transistor (3T) configuration, without a transfer transistor, or in other pixel cell configurations having more or less transistors.

Figure 4A:
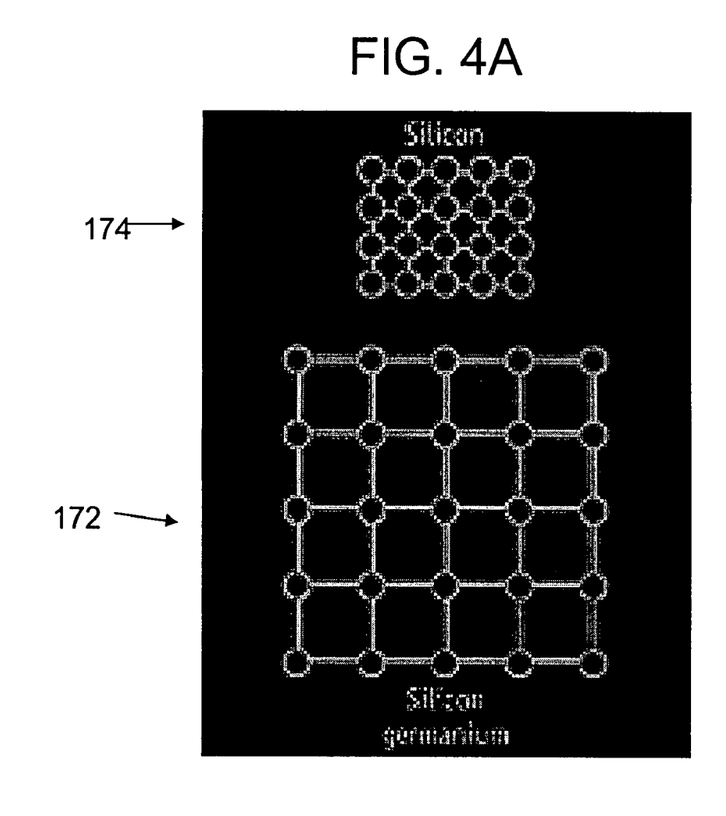
FIG. 4 illustrates a strained silicon layer constructed in accordance with an exemplary embodiment of the invention.
Figure 4B:
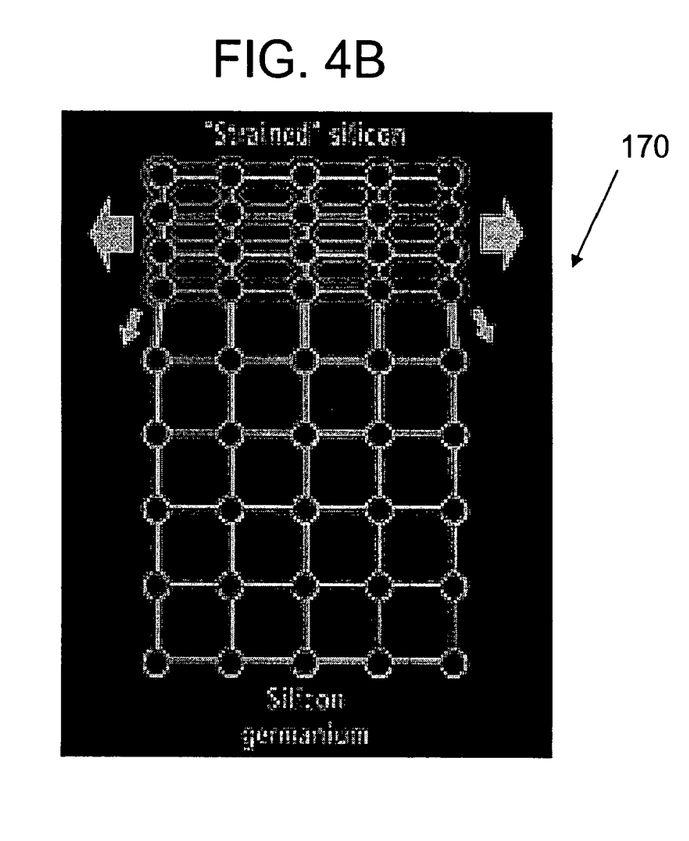

Referring to FIGS. 4A and 4B, the strained silicon layer 170 used in the pixel cell 200 of FIG. 3, comprises two layers, a silicon-germanium (SiGe) base layer 172 and a silicon layer 174. The silicon layer 174 is formed over the SiGe base layer 172. The silicon layer 174 can be formed by conventional methods. For example, the silicon layer 174 can be formed by atomic layer deposition (ALD) or chemical vapor deposition (CVD). As the two layers 172, 174 are formed, the silicon atoms of the silicon layer 174 "align" themselves with the silicon atoms in the SiGe base layer 172, as illustrated in FIG. 4B. Because of the alignment, a biaxial strain is imparted on the silicon atoms of the silicon layer 174, thus forming strained silicon layer 170. The strained silicon layer 170 has electronic properties that are superior to those of bulk silicon for certain imager applications. Specifically, the strained silicon layer 170 has greater electron and hole mobilities, which translate into greater drive current capabilities for imaging device transistors. The charge transfer from the photodiode 150 (FIG. 3) to the floating diffusion region 116 (FIG. 3) is increased when compared to conventional CMOS imagers.

Significantly, for reset, the charge transfer to floating diffusion region 116 (FIG. 3) from the source/drain region 130 (FIG. 3) increases as well.

The SiGe base layer 172 is deposited to a desired ratio of silicon to germanium. The desired ratio depends on the desired amount of strain applied to the silicon layer 174. The SiGe base layer 172 preferably has a germanium concentration of about 30 percent to about 40 percent, but the concentration can be optimized for a particular application based on desired photo response, mobility enhancement, or other factors. Typical SiGe alloys are characterized as $Si_XGe_{(1-XX)}$, where X is the mole fraction. Other alloys of silicon-germanium can be used as the base layer 172. For example, $Si_XGe_YC_Z$ can also be used as the base layer 172 (FIG. 4B), where X, Y, and Z are mole fractions of Si, Ge, and C, respectively, and X+Y+Z=1.

The strained silicon layer 170 has, for example, a thickness of about 500 Å to about 1000 Å. It should be noted, however, that the thickness could vary by forming a relaxed SiGe top layer over a graded bottom SiGe layer as a composite stack. In that case, each of the layers can be tailored separately with varying concentrations of germanium, and varying thicknesses of, for example, about 200 Å to about 800 Å. The thicknesses disclosed are only examples, and should not be construed to be limiting in any way. Additionally, multiple SiGe layers, e.g., graded SiGe layer 172a and SiGe base layer 172b (FIG. 5 discussed further below), having varying concentrations of germanium can be stacked to form the SiGe layer 172. It should also be noted that the top silicon layer 172 can be formed in association with the substrate 160 if SiGe or SiGeC or any other material capable of straining the top silicon layer 172 is used as the material for forming the substrate 160.

Figure 5:
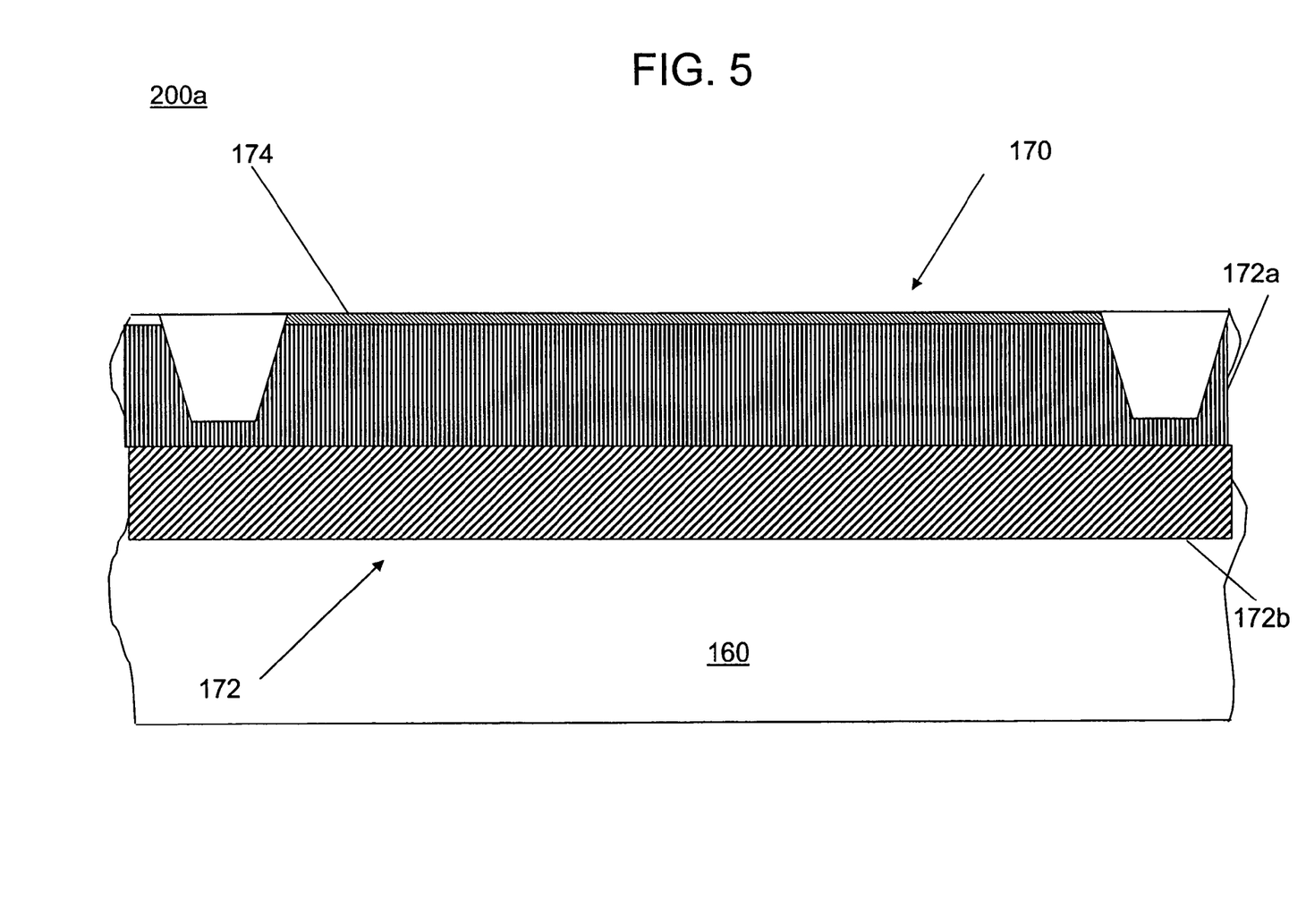
FIG. 5 illustrates a cross-sectional view of a pixel cell precursor incorporating a strained silicon layer constructed in accordance with an exemplary embodiment of the invention

The $Si_XGe_{(1-XX)}$ base layer 172 can be extended (i.e., the thickness can be increased) so that it forms a larger part of the substrate itself. For example, FIG. 5 illustrates a pixel cell precursor 200a with a thicker SiGe base layer 172 comprising a graded SiGe layer 172a and a bottom SiGe base layer 172b. In this example, a majority of a photodiode 150 (FIG. 3) can be formed as part of the SiGe base layer 172, significantly improving the red, infrared (IR), and near infrared (NIR) responses in the pixel cell 200 (FIG. 3). By tailoring the thickness of the $Si_XGe_{(1-X)}$ base layer 172, the mole fraction "X," and the doping level, the red, IR, and NIR absorption characteristics can be tuned. Red, IR, and NIR response might be critical in some applications, e.g., automobile markets. By creating a thicker SiGe base layer 172 and incorporating strain in the silicon layer 174, a desired sensor having high quantum efficiencies in both blue and red regions of the visible spectrum can be achieved.

FIGS. 6-9 show one exemplary method of forming a pixel cell with a strained silicon layer 170 in accordance with the present invention at various stages of processing. For discussion purposes, the invention is described as being formed in a p-type substrate; however, it should be understood that complementary structures may also be formed in an n-type substrate. Moreover, other photosensor structures may also be used.

Figure 6:
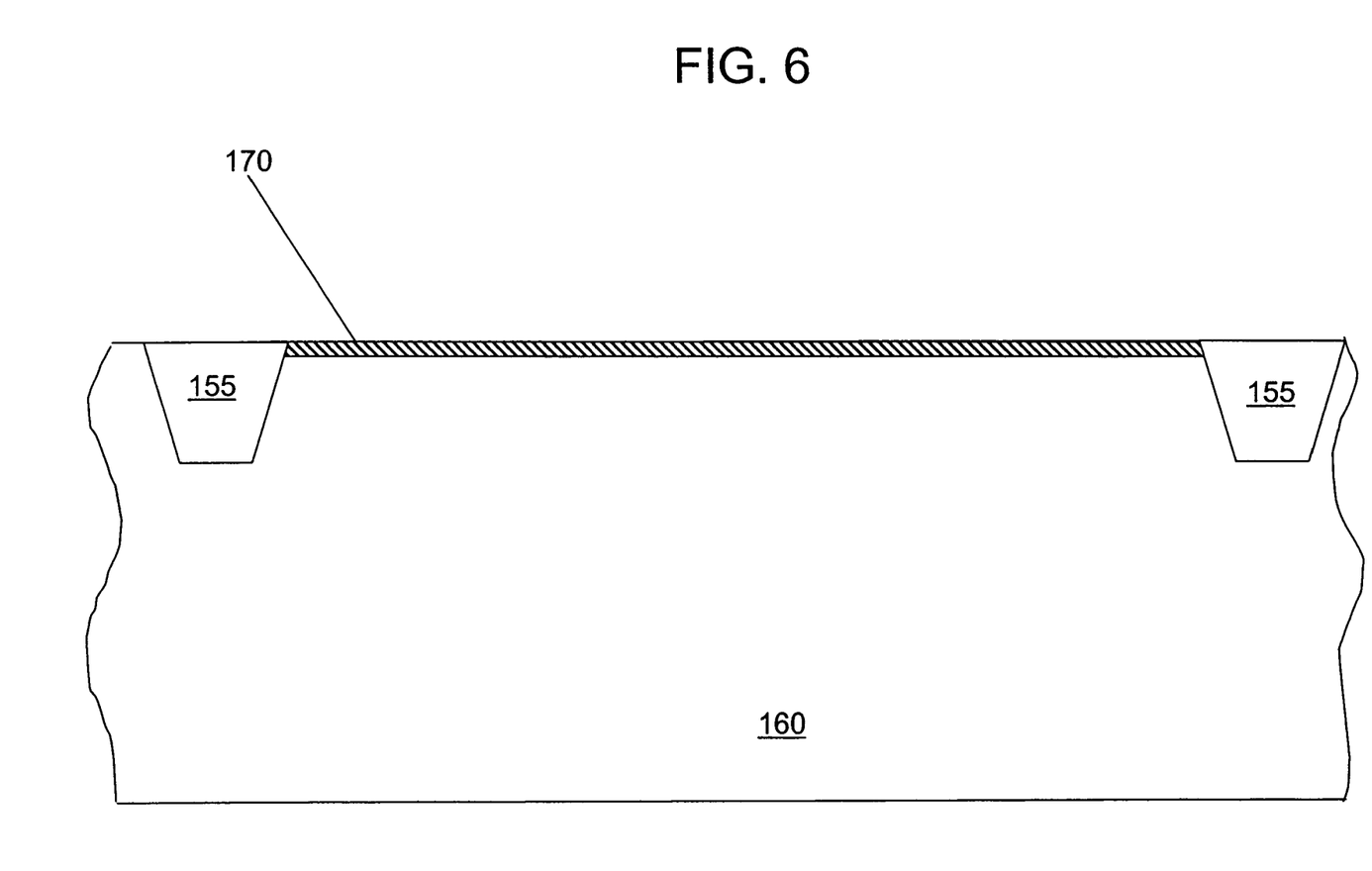
FIG. 6 illustrates a stage of processing of a pixel cell, performed in accordance with an exemplary embodiment of the invention.

Referring to FIG. 6, a substrate 160 having isolation regions 155 is provided. The isolation regions 155 are formed to electrically isolate regions of the substrate where pixel cells will later be formed. The isolation regions 155 can be formed by any known technique such as thermal oxidation of underlying silicon in a LOCOS process, or by etching trenches and filling them with oxide in a shallow trench isolation (STI) process. Following the formation of isolation regions 155, a strained silicon layer 170 is formed in association with the p-type substrate 160. The strained silicon layer 170 is formed either by selective epitaxial growth or CVD as discussed above with respect to FIGS. 4A and 4B.

It should be noted that FIG. 6 is only one embodiment of the present invention, and that, if desired, the strained silicon layer 170 could be comprised of an extended SiGe base layer 172 further comprising a graded SiGe layer 172a and a bottom SiGe base layer 172b, as discussed above with respect to FIG. 5. The strained silicon layer 170 in the example illustrated by FIG. 5 would be made by forming a bottom SiGe layer 172b having desired properties; forming a graded SiGe layer 172a over the SiGe base layer 172b; and forming a silicon layer 174 over the graded SiGe base layer.

Figure 7:
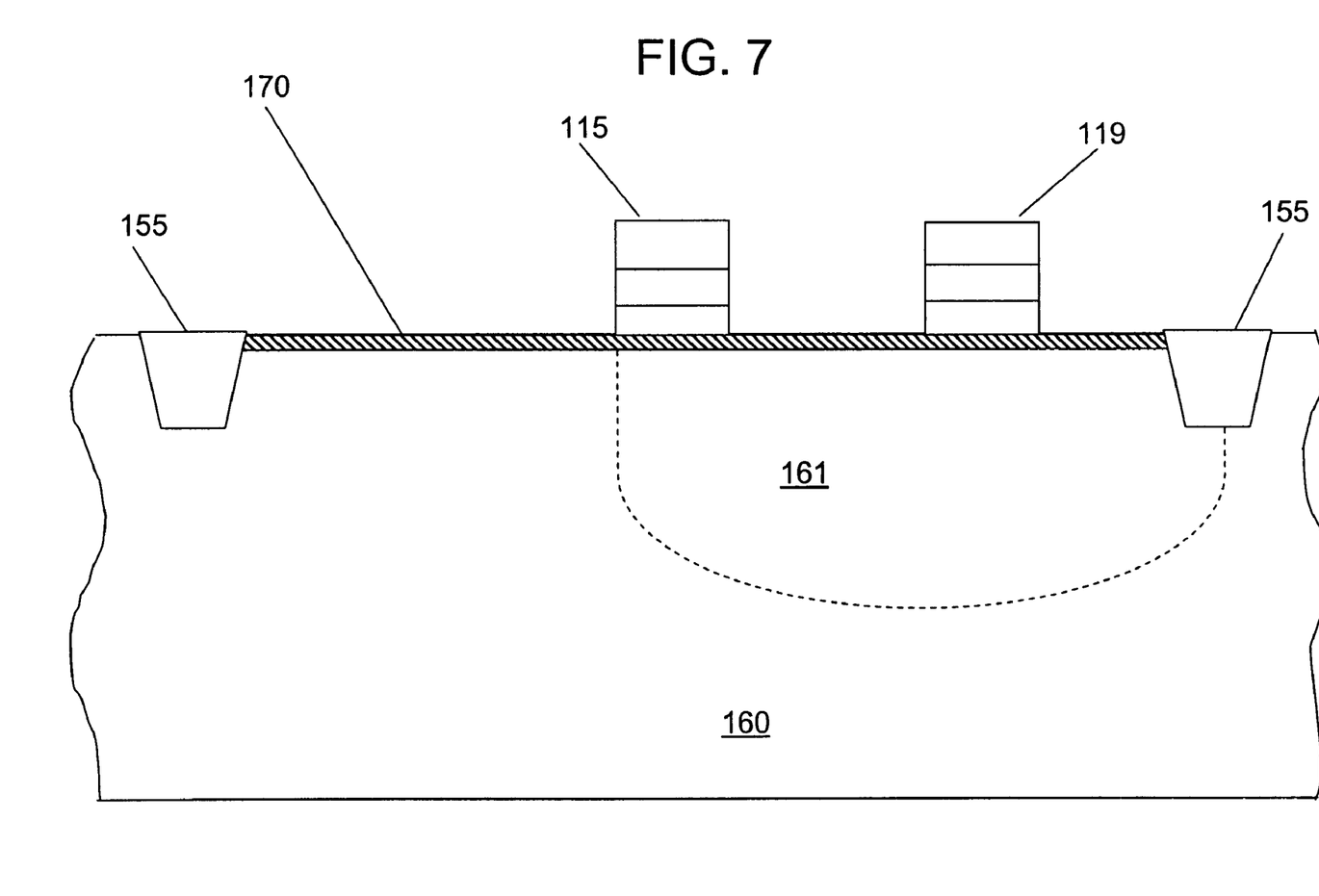
FIG. 7 illustrates a further stage of processing of the FIG. 6 pixel cell.

Next the circuitry of the pixel cell, including the transfer transistor gate; reset transistor gate; the source follower transistor gate; and the row select transistor gate are all formed by well-known methods (e.g., blanket deposition of gate oxide, doped polysilicon, deposition of metal for a silicide, annealing to form a silicide, then patterning and etching). FIG. 7 shows an exemplary embodiment of the pixel cell 200 with formed gate stacks 115, 119 for the transfer transistor 126 (FIG. 3) and reset transistor 128 (FIG. 3), respectively. Although shown as a 4-transistor (4T) embodiment, the invention can also be used in a 3-transistor (3T) embodiment, in which case no transfer transistor 126 is formed, or other pixel cells having more or less transistors.

A p-type well 161 is formed after the formation of the gate stacks 115, 119. The p-type well 161 may be formed by blanket implantation or by masked implantation. The p-well implant may be conducted so that the well 161 and a p-type periphery logic well (not shown), which will contain logic circuits for controlling the pixel array, have different doping profiles. As known in the art, multiple high energy implants may be used to tailor the profile of the p-type well 161. The p-well 161 is doped to a higher dopant concentration than the p-type substrate 160.

Figure 8:
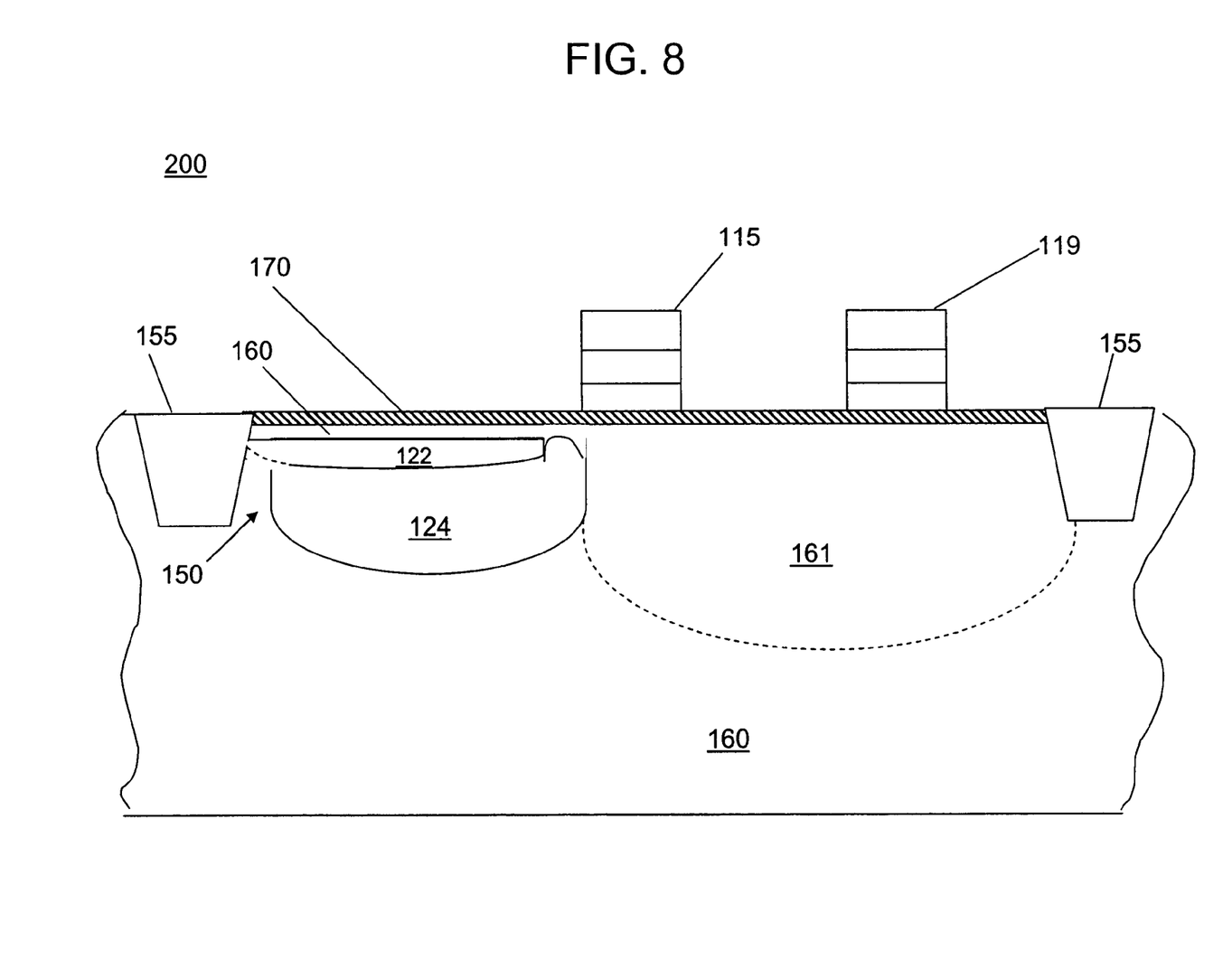
FIG. 8 illustrates a further stage of processing of the FIG. 7 pixel cell.

Referring to FIG. 8, a photodiode 150 is formed in association with the substrate 160 by methods known in the art, such as ion implantation. It should be noted that the photodiode 150 illustrated in FIG. 8 has a top junction that is preferably deeper in the substrate than the strained silicon layer 170. Therefore, a portion of substrate 160 remains above the photodiode 150. This portion of the substrate remains undoped. In a less desirable embodiment of the pixel cell 200 in which the top junction of the photodiode 150 is in contact with the strained silicon layer 170, dark current may be more prevalent. For example, in the case in which there are defects in the SiGe/Si interface of the strained silicon layer 170, increased leakage will result in dark current. Under pinned voltage conditions, if the depletion region extends into the defect region, there will be an increase in dark current. Therefore, by forming the photodiode 150 deeper in the substrate than the strained silicon layer 170, dark current can be limited.

Figure 9:
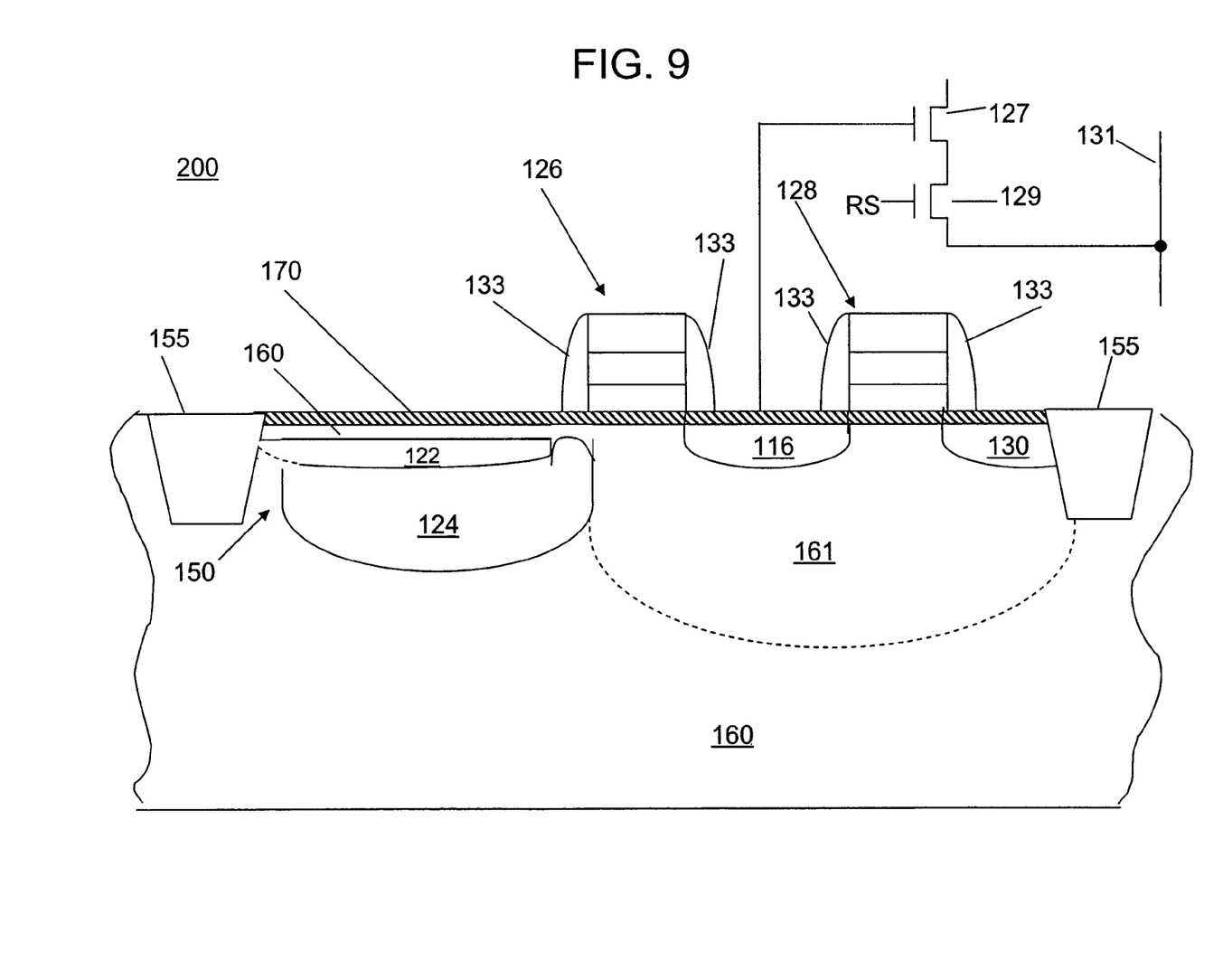
FIG. 9 illustrates a cross-sectional view of a pixel cell incorporating a strained silicon layer constructed in accordance with an exemplary embodiment of the invention.

In FIG. 9, floating diffusion region 116 and source/drain region 130 are formed within the p-type well 161. These regions 116, 130 are formed in association with the strained silicon layer, and are doped to an n-type conductivity (i.e., they are doped regions). For exemplary purposes, doped regions 116, 130 are n+doped and may be formed by applying a mask to the substrate 160 and doping the regions 116, 130 by ion implantation. The illustrated pixel cell 200 has doped regions 116, 130 that are formed within and under the strained silicon layer 170. This is merely one embodiment of the pixel cell 200, and should not be construed to be limiting in any way. Finally, gate stack sidewall insulators 133 are formed on the sides of the gate stacks 115, 119 using known techniques, to form transfer transistor 126 and reset transistor 128, respectively.

The pixel cell 200 is essentially complete at this stage, and conventional processing methods may be used to form insulating, shielding, and metallization layers to connect gate lines and other connections to the cell. For example, the entire surface may be covered with a passivation layer of, for example, silicon dioxide, BSG, PSG, or BPSG, which is CMP planarized and etched to provide contact holes, which are then metallized to provide contacts. Conventional layers of conductors and insulators may also be used to interconnect the structures and to connect the pixel to peripheral circuitry.

Figure 10:
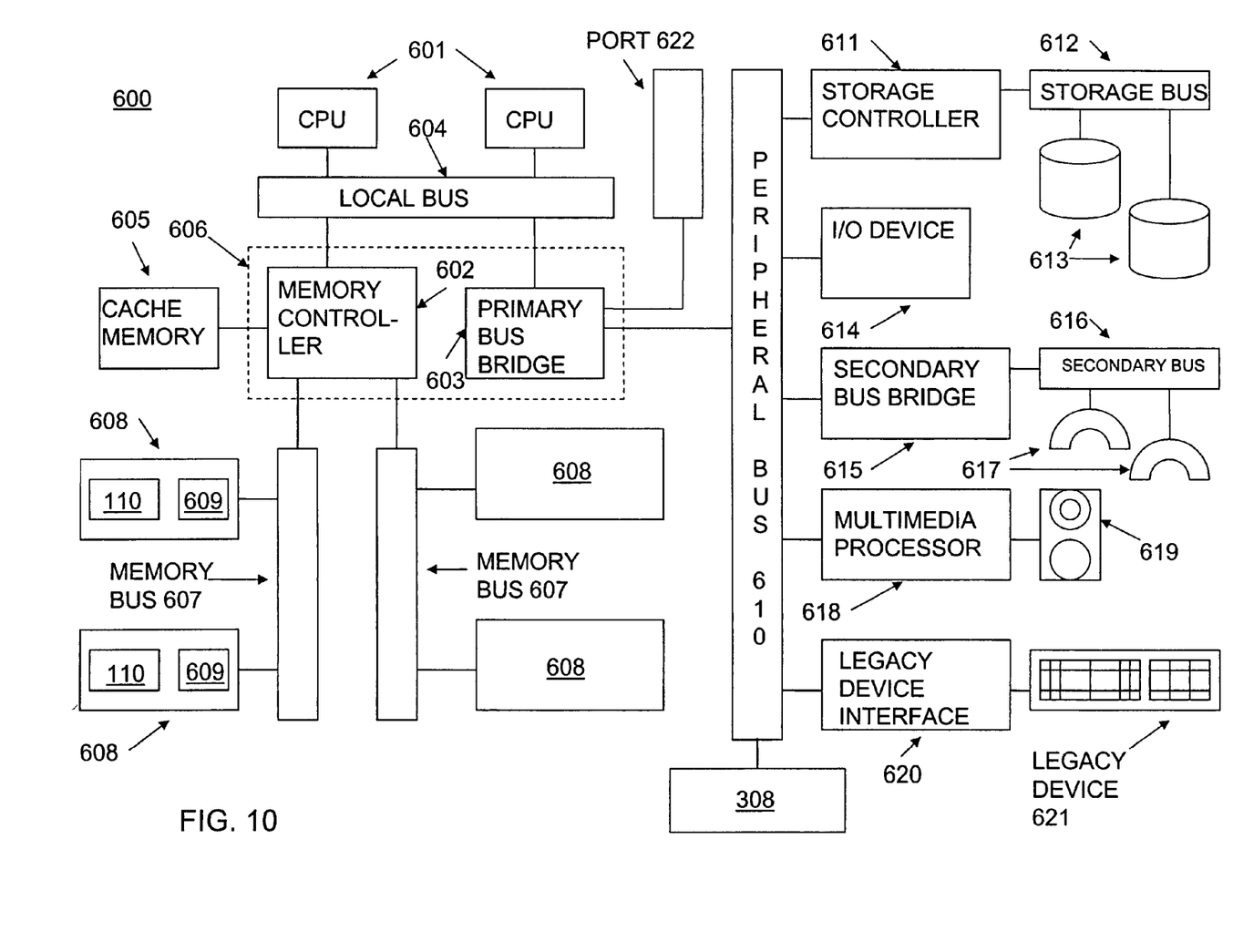
FIG. 10 is a schematic diagram of a processor system incorporating an imaging device having a pixel cell constructed in accordance with an exemplary embodiment of the invention.

FIG. 10 illustrates an exemplary processing system 600 that may utilize an imaging device, for example, a CMOS imager device 308 (FIG. 1), incorporating a pixel cell 200 (FIG. 3) constructed in accordance with the embodiment of the invention illustrated in FIGS. 6-9. Any one of the electronic components shown in FIG. 10, including CPU 601 and imaging device 308, may be fabricated as an integrated circuit for use in processing images.

The processing system 600 includes one or more processors 601 coupled to a local bus 604. A memory controller 602 and a primary bus bridge 603 are also coupled to the local bus 604. The processing system 600 may include multiple memory controllers 602 and/or multiple primary bus bridges 603. The memory controller 602 and the primary bus bridge 603 may be integrated as a single device 606.

The memory controller 602 is also coupled to one or more memory buses 607. Each memory bus accepts memory components 608 which include at least one memory device 110. The memory components 608 may be a memory card or a memory module. Examples of memory modules include single inline memory modules (SIMMs) and dual inline memory modules (DIMMs). The memory components 608 may include one or more additional devices 609. For example, in a SIMM or DIMM, the additional device 609 might be a configuration memory, such as a serial presence detect (SPD) memory. The memory controller 602 may also be coupled to a cache memory 605. The cache memory 605 may be the only cache memory in the processing system. Alternatively, other devices, for example, processors 601 may also include cache memories, which may form a cache hierarchy with cache memory 605. If the processing system 600 includes peripherals or controllers which are bus masters or which support direct memory access (DMA), the memory controller 602 may implement a cache coherency protocol. If the memory controller 602 is coupled to a plurality of memory buses 607, each memory bus 607 may be operated in parallel, or different address ranges may be mapped to different memory buses 607.

The primary bus bridge 603 is coupled to at least one peripheral bus 610. Various devices, such as peripherals or additional bus bridges may be coupled to the peripheral bus 610. These devices may include a storage controller 611, a miscellaneous I/O device 614, a secondary bus bridge 615, a multimedia processor 618, and a legacy device interface 620. The primary bus bridge 603 may also be coupled to one or more special purpose high speed ports 622. In a personal computer, for example, the special purpose port might be the Accelerated Graphics Port (AGP), used to couple a high performance video card to the processing system 600.

The storage controller 611 couples one or more storage devices 613, via a storage bus 612, to the peripheral bus 610. For example, the storage controller 611 may be a SCSI controller and storage devices 613 may be SCSI discs. The I/O device 614 may be any sort of peripheral. For example, the I/O device 614 may be a local area network interface, such as an Ethernet card. The secondary bus bridge may be used to interface additional devices via another bus to the processing system. For example, the secondary bus bridge 616 may be a universal serial port (USB) controller used to couple USB devices 617 via to the processing system 600. The multimedia processor 618 may be a sound card, a video capture card, or any other type of media interface, which may also be coupled to one additional device such as speakers 619. The legacy device interface 620 is used to couple legacy devices 621, for example, older styled keyboards and mice, to the processing system 600.

The processing system 600 illustrated in FIG. 10 is only an exemplary processing system with which the invention may be used. While FIG. 10 illustrates a processing architecture especially suitable for a general purpose computer, such as a personal computer or a workstation, it should be recognized that well known modifications can be made to configure the processing system 600 to become more suitable for use in a variety of applications. For example, many electronic devices which require processing may be implemented using a simpler architecture which relies on a CPU 601 coupled to memory components 608 and/or memory devices 110. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The imaging devices of the present invention, when coupled to a pixel processor, for example, may be implemented in digital cameras and video processors and recorders. Modifications may include, for example, elimination of unnecessary components, addition of specialized devices or circuits, and/or integration of a plurality of devices.

It should again be noted that although the invention has been described with specific references to CMOS pixel cells having a strained silicon layer, the invention has broader applicability and may be used in any imaging apparatus. For example, the present invention may be used in conjunction with CCD imagers. Similarly, the processes described above are but only a few methods of many that may be used. The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. An imager device, comprising:
   a pixel cell array including at least one pixel cell, comprising:
      a photosensor formed in association with an upper portion of a semiconductor substrate, the photosensor capable of converting photons to an electrical charge;
      a charge transfer device capable of transferring the electrical charge to a doped region formed in association with the semiconductor; and
      a strained silicon layer formed over the photosensor, the strained silicon layer capable of enhancing the mobility of the electrical charge; and
   readout circuitry coupled to the pixel cell array for electrical charge readout.

2. The imager device of claim 1, wherein the strained silicon layer enhances the responsiveness of the photosensor to blue wavelengths of light.

3. The imager device of claim 1, wherein the strained silicon layer increases the efficiency of the transfer of the electrical charge from the photosensor to the doped region through the charge transfer device.

4. The imager device of claim 1, wherein the strained silicon layer decreases a potential barrier between the photosensor and the charge transfer device.

5. The imager device of claim 1, wherein the strained silicon layer enhances the transfer of the electrical charge from the doped region to a second charge transfer device.

6. The imager device of claim 1, wherein the charge transfer device is a transistor.

7. The imager device of claim 1, wherein the strained silicon layer has a thickness of about 500 Å to about 1000 Å.

8. The imager device of claim 1, wherein the strained silicon layer comprises a top silicon layer formed over a silicon-germanium base layer.

9. The imager device of claim 8, wherein the silicon-germanium base layer comprises $Si_XGe(1-X)$.

10. A method of forming an imager, comprising:
forming a pixel array, comprising:
forming a plurality of first doped regions in association with an upper portion of a semiconductor substrate, at least one first doped region capable of charge collection;
forming a plurality of second doped regions in association with the upper portion of a semiconductor substrate, at least one second doped region capable of accepting charge from the at least one first doped region;
forming a plurality of charge transfer devices, at least one charge transfer device capable of transferring charge from the at least one first doped region to the at least one second doped region; and
forming a strained silicon layer in association with the at least one first doped region, at least one second doped region, and the at least one transfer device; and
forming readout circuitry coupled to the pixel cell array.

11. The method of claim 10, wherein the strained silicon layer enhances the mobility of the charge.

12. The method of claim 10, wherein the strained silicon layer enhances the responsiveness of the at least one first doped region to blue wavelengths of light.

13. The method of claim 10 wherein the strained silicon layer increases the efficiency of the transfer of the charge from the at least one doped region to the at least one second doped region through the at least one charge transfer device.

14. The method of claim 10, wherein the strained silicon layer decreases a potential barrier between the at least one first doped region and the at least one charge transfer device.

15. The method of claim 10, further comprising forming a plurality of second charge transfer devices, at least one second charge transfer devices in electrical communication with the at least one second doped region.

16. The method of claim 10, wherein the strained silicon layer has a thickness of about 500 Å to about 1000 Å.

17. An imager, comprising:
a plurality of pixel cells, at least one of the pixel cells, comprising;
a photosensor formed in association with an upper portion of a semiconductor substrate, the photosensor capable of generating dark current;
a transistor formed in association with the photosensor;
a floating diffusion region capable of accepting charge from the photosensor; and
a strained silicon layer formed over the photosensor, the strained silicon layer capable of reducing dark current generation and improving the carrier mobility of electrons.

18. The imager of claim 17, wherein the strained silicon layer has a thickness of about 500 Å to about 1000 Å.

19. The imager of claim 17, wherein the strained silicon layer comprises a top silicon layer formed over a silicon-germanium base layer.

* * * * *